(12) United States Patent
Peng

(10) Patent No.: US 8,395,556 B2
(45) Date of Patent: Mar. 12, 2013

(54) METHOD FOR DETERMINING THE ANTENNA MINIMUM MEASUREMENT DISTANCE

(75) Inventor: Hongli Peng, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 743 days.

(21) Appl. No.: 12/516,345

(22) PCT Filed: May 17, 2007

(86) PCT No.: PCT/CN2007/001603
§ 371 (c)(1),
(2), (4) Date: Dec. 29, 2009

(87) PCT Pub. No.: WO2008/064544
PCT Pub. Date: Jun. 5, 2008

(65) Prior Publication Data
US 2010/0109956 A1    May 6, 2010

(30) Foreign Application Priority Data
Nov. 30, 2006   (CN) .......................... 2006 1 0160875

(51) Int. Cl.
*G01R 29/10* (2006.01)
(52) U.S. Cl. ...................... 343/703; 343/701; 455/67.12; 455/67.13; 455/67.14
(58) Field of Classification Search .................. 343/701, 343/703; 455/67.11, 67.12, 67.13, 67.14
See application file for complete search history.

(56) References Cited

U.S. PATENT DOCUMENTS

| | | | |
|---|---|---|---|
| 6,329,953 B1 * | 12/2001 | McKivergan ................. | 343/703 |
| 6,850,851 B1 * | 2/2005 | Fourestie et al. ............... | 702/65 |
| 7,035,594 B2 * | 4/2006 | Wallace et al. ............ | 455/67.12 |
| 7,102,562 B2 * | 9/2006 | Moller et al. ..................... | 342/4 |
| 7,466,142 B2 * | 12/2008 | Garreau et al. ............... | 324/628 |
| 7,615,188 B2 * | 11/2009 | Iyama et al. .................... | 422/50 |
| 2005/0176375 A1 * | 8/2005 | Bednasz et al. ............. | 455/67.12 |

FOREIGN PATENT DOCUMENTS

| CN | 1504756 A | 6/2004 |
|---|---|---|
| CN | 1621854 A | 6/2005 |

OTHER PUBLICATIONS

CTIA Certification Program,Test Plan for Mobile Station Over the Air Performance.Method of Measurement for Radiated RF Power and Receiver Performance.Apr. 2005.pp. 10,77-82.

* cited by examiner

Primary Examiner — Jason M Crawford
(74) Attorney, Agent, or Firm — Li & Cai Intellectual Property (USA) Office

(57) ABSTRACT

A method for determining the minimum measurement distance of an antenna of a wireless mobile terminal, comprising the following steps: establishing a test environment of an antenna of a wireless mobile terminal to be tested; determining electromagnetic scattering dimension of the antenna of the wireless mobile terminal to be tested and an electromagnetic scattering body in a predetermined spatial area in the test environment; and calculating the minimum measurement distance of the antenna of the wireless mobile terminal according to the determined electromagnetic scattering dimension. Electromagnetic scattering dimension of the mobile phone antenna and the electromagnetic scattering body in the predetermined spatial area is determined and measured in a simulated network environment in an electric wave anechoic chamber, and parameters of the minimum measurement distance of the mobile phone antenna can be calculated and obtained. The method has low requirement on environment and is easy to be tested and convenient to be carried out.

19 Claims, 3 Drawing Sheets

METHOD FOR DETERMINING THE ANTENNA MINIMUM MEASUREMENT DISTANCE

CROSS REFERENCE TO RELATED APPLICATIONS OR PRIORITY CLAIM

This application is a national phase of International Application No. PCT/CN2007/001603, entitled "THE METHOD FOR DETERMINING THE MINIMUM MEASUREMENT DISTANCE OF ANTENNA", which was filed on May 17, 2007, and which claims priority of Chinese Patent Application No. 200610160875.3, filed Nov. 30, 2006.

FIELD OF THE INVENTION

The present invention relates to a method for determining the antenna minimum measurement distance of a wireless mobile terminal, more specifically relates to a method for determining the antenna minimum measurement distance of a cellular mobile phone (referred to as mobile phone hereinafter).

BACKGROUND OF THE INVENTION

The development of mobile telephone technology raises a higher requirement on the performance test technology of mobile phone antenna. The present performance test technology of the mobile phone antenna do not consider how to test the performance of a mobile phone antenna in a real talking condition of a mobile phone, i.e. in a condition where "human" factors, for example, a mobile phone gets close to a human head or the head, neck, shoulder and etc. of a human body, are involved. The first step to solve the problem is to determine the performance test condition of the mobile phone antenna in the real talking condition, wherein the first condition is to determine the minimum measurement distance of a mobile phone antenna.

SUMMARY OF THE INVENTION

Considering the problem existed in the present antenna performance test technology, the present invention aims to provide a method for determining the antenna minimum measurement distance of a wireless mobile terminal.

According to one aspect of the invention, a method for determining the minimum measurement distance of an antenna of a wireless mobile terminal is provided, which comprises the following steps: step 102, establishing an antenna testing environment of a wireless mobile terminal to be tested; step 104, determining electromagnetic scattering dimension of the antenna of the mobile terminal to be tested and an electromagnetic scattering body in a predetermined spatial area in the test environment; and step 106, calculating the minimum measurement distance of the antenna of the wireless mobile terminal according to the determined electromagnetic scattering dimension.

Preferably, the electromagnetic scattering dimension is the minimum diameter of a spherical surface encircling both the wireless mobile terminal under tested and the electromagnetic scattering body in the predetermined spatial area. The predetermined spatial area refers to a spherical surface spatial area determined with a diameter from $0.01\lambda$ to $0.1\lambda$, wherein $\lambda$ is the wavelength of carrier wave.

Preferably, the step 102 comprises the following steps: putting the wireless mobile terminal under tested and the antenna thereof and a model of the electromagnetic scattering body on a test platform in a microwave anechoic chamber and connecting with a simulator through cables; connecting the radio frequency port of a standard antenna with the simulator through a radio frequency cable; configuring parameters of the simulator; and setting the back light of the wireless mobile terminal to be tested to the closed state or the darkest state and setting the wireless mobile terminal to be tested to the standby state.

Preferably, the cables are low-loss cables; the radio frequency cable is a low-power radio frequency cable; and the simulator is a network simulator.

Preferably, the step 106 comprises the following steps: calculating a first distance $r_1$, a second distance $r_2$ and a third distance $r_3$ according to the electromagnetic scattering dimension; taking the maximum of the first distance, the second distance and the third distance as the minimum measurement distance of the antenna of the wireless mobile terminal, wherein $r_1=2l^2/\lambda$, $r_2=3\lambda$, $r_3=3l$, $l$ is the electromagnetic scattering dimension, and $\lambda$ is the wavelength of carrier wave.

The step 106 can also comprise the following steps: calculating a first distance $r_1$ and a second distance $r_2$ according to the electromagnetic scattering dimension; taking the maximum of the first distance and the second distance as the minimum measurement distance of the antenna of the wireless mobile terminal, wherein $r_1=2l^2/\lambda$, $r_2=3\lambda$, $l$ is the electromagnetic scattering dimension, and $\lambda$ is the wavelength of carrier wave.

In addition, the electromagnetic scattering body in the predetermined spatial area according to the present invention is a human body and the electromagnetic scattering body comprises the head of the user of the wireless mobile terminal and further comprises the shoulder of the user of the wireless mobile terminal.

With the universal method for determining the minimum measurement distance of a mobile phone antenna of the present invention, electromagnetic scattering dimension of the mobile phone antenna and the electromagnetic scattering body in the predetermined spatial area is determined and measured in a simulated network environment in an electric wave anechoic chamber, and parameters of the minimum measurement distance of the mobile phone antenna can be calculated and obtained. The method has low requirement on environment and is easy to be tested and convenient to be carried out.

Other characteristics and advantages of the present invention will be described in the following specification, and will be apparent partly from the specification and embodiments of the present invention. The objects and other advantages can be realized and obtained through the structure of the specification, claims, and the drawings.

BRIEF DESCRIPTION OF THE DRAWINGS

The drawings herein are used to provide further understanding of this invention and constitute a part of this application. Exemplary embodiments of this invention and the description thereof are used to describe this invention and shall not be construed as improper limitations on the same. In the accompanying drawings.

DETAILED DESCRIPTION OF THE PREFERRED EMBODIMENTS

In the present invention, the mobile phone to be tested and the antenna thereof are processed according to the Black-box, that is, detailed process of the mobile phone to be tested and the antenna thereof will be not involved. Preferred embodiments of the present invention will be illustrated in combination with the accompanying drawings in details as follows. If not conflict, the embodiments and the technical features of the embodiments can be combined with each other.

Figure 1:
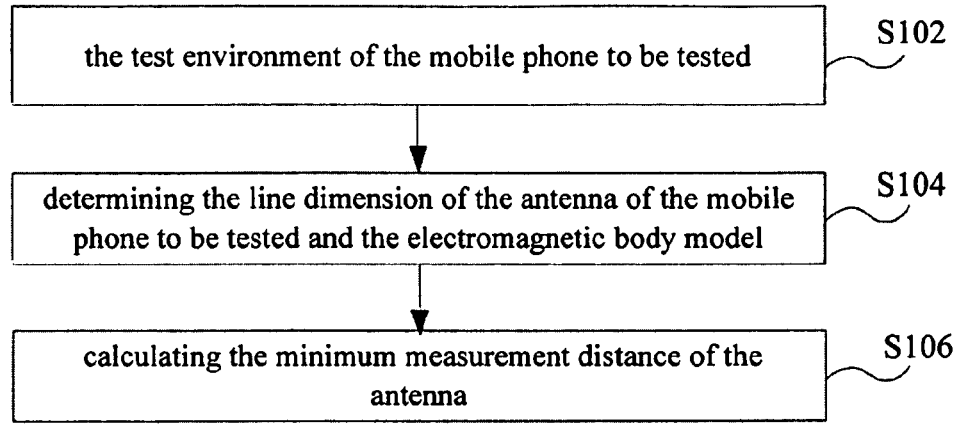
FIG. 1 is a flowchart of the method for determining the minimum measurement distance of a mobile phone antenna according to the embodiments of the invention.
Figure 2:
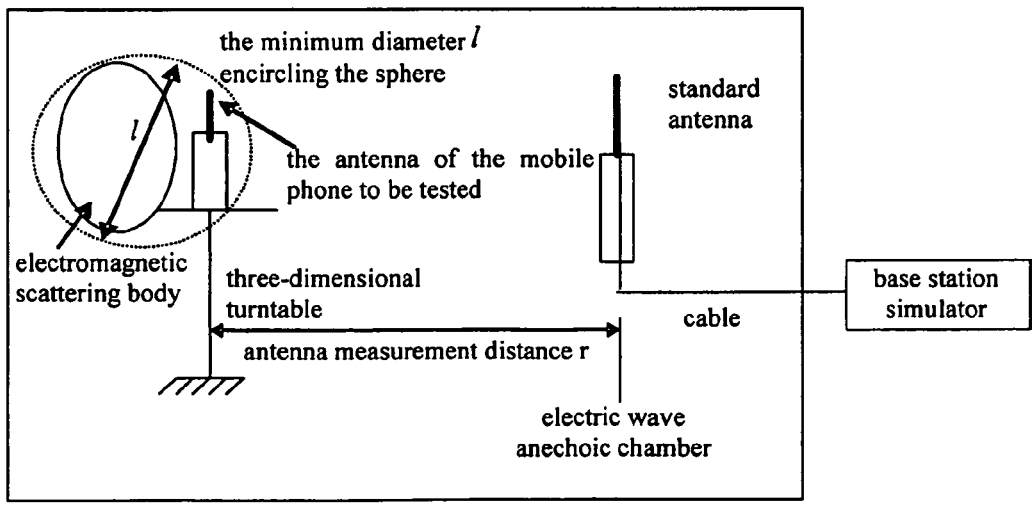
FIG. 2 is a schematic diagram of the definition of the antenna measurement radio communication link and the minimum measurement distance of a mobile phone antenna.
Figure 3:
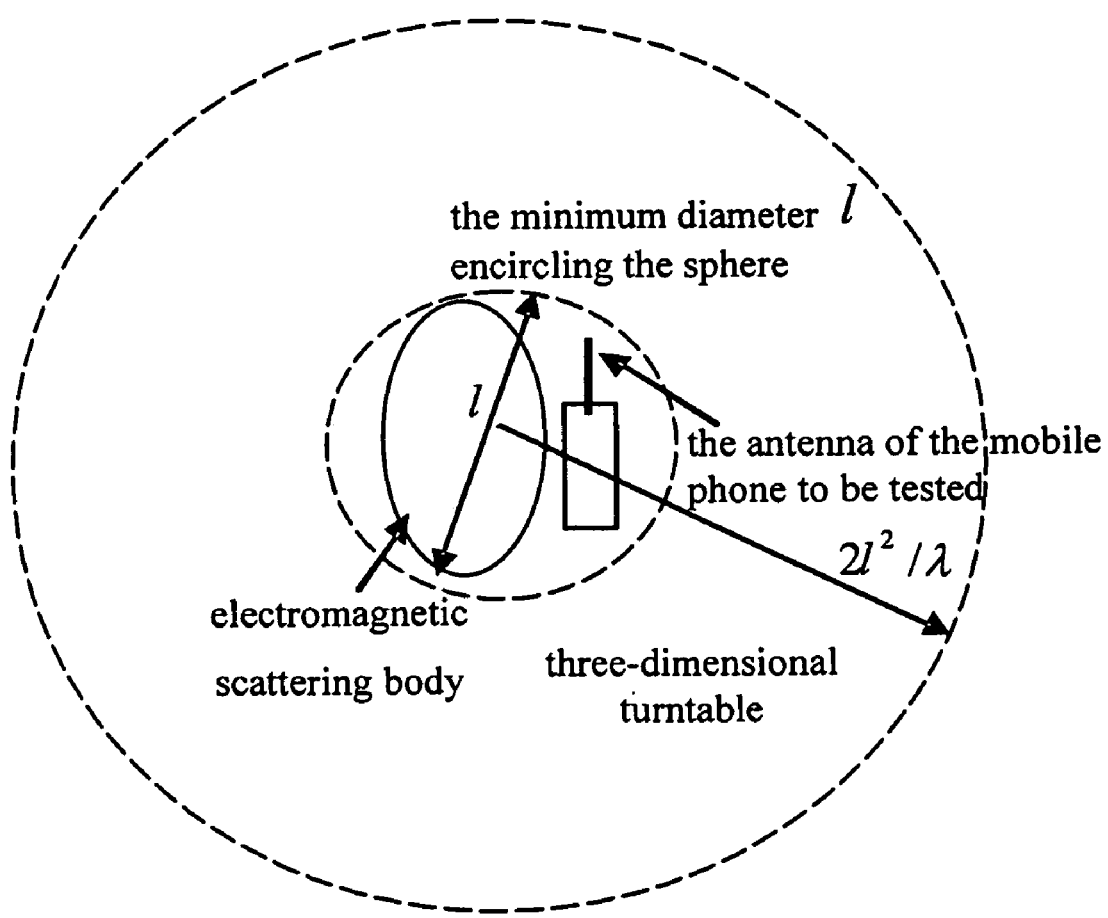
FIG. 3 is a schematic diagram of determining electromagnetic scattering dimension of a mobile phone antenna to be tested and an electromagnetic scattering body in a predetermined spatial area.

FIG. 1 is a flowchart of the method for determining the minimum measurement distance of a mobile phone antenna according to the embodiments of the invention; FIG. 2 is a schematic diagram of the definition of the antenna measurement radio communication link and the minimum measurement distance of a mobile phone antenna; and FIG. 3 is a schematic diagram of determining electromagnetic scattering dimension of a mobile phone antenna to be tested and an electromagnetic scattering body in a predetermined spatial area. The procedure of FIG. 3 will be described in details in combination with FIGS. 1 and 2.

As shown in FIG. 1, the method for determining the antenna minimum measurement distance of a wireless mobile terminal comprises the following steps:

Step 102, establishing an antenna testing environment of a wireless mobile terminal to be tested. Preferably, the following steps are included: putting the wireless mobile terminal under tested and the antenna thereof and a model of the electromagnetic scattering body on a test platform in a microwave anechoic chamber, and connecting with a simulator through cable; connecting the radio frequency port of a standard antenna with the simulator through radio frequency cable; configuring parameters of the simulator; setting the back light of the wireless mobile terminal to be tested to the closed state or the darkest state, and setting the wireless mobile terminal to be tested to the standby state.

Wherein, preferably, the electromagnetic scattering dimension is the minimum diameter of a virtual spherical surface encircling both the wireless mobile terminal under tested and the electromagnetic scattering body in the predetermined spatial area; preferably, the cable is low-loss cables; and the radio frequency cable is low-power radio frequency cable; and the simulator is preferably a network simulator. The step of configuring parameters of the simulator can be achieved by configuring the voice service to be a fixed voice service with a decided voice traffic. The model mentioned above comprises the mobile phone to be tested and the antenna thereof and an electromagnetic body model.

Preferably, the predetermined spatial area refers to a spatial area of a spherical surface determined with a diameter from $0.01\lambda$ to $0.1\lambda$, wherein $\lambda$ is the wavelength of carrier wave.

The above process will be described in details as follows, comprising:

Step 1: putting the mobile phone under tested and the antenna thereof and the model of a human head in a microwave anechoic chamber, which is electromagnetically shielded from external electromagnetic waves, and connecting with the network simulator via low-loss cables;

Step 2, putting the mobile phone to be tested (including its antenna) on a test platform. Since the test platform here should be a rotary platform providing support for measurement of the mobile phone to be tested, it should not affect the measurement of the mobile phone to be tested. Therefore, the test platform should be a test platform made of materials of low electromagnetic loss;

Step 3, connecting the radio frequency port of a standard antenna with one end of the low-power radio frequency cable whose loss is known, and connecting the other end of the low-power radio frequency cable with the network simulator as shown in FIG. 2. A high frequency choke exterior to the low-power radio frequency cable is set to avoid loss of electromagnetic signals in internal transmission;

Step 4, configuring parameters of the network simulator and configuring the voice service to be a fixed voice service with a decided voice traffic;

Step 5, setting the back light of the mobile phone to be tested to the closed state or the darkest state; and Step 6, setting the mobile phone to be tested to the standby state. In case of a clamshell phone, opening the upper cover to the upmost extend.

Step 104, determining electromagnetic scattering dimension of the antenna of the mobile terminal to be tested and the electromagnetic scattering body in a predetermined spatial area in the test environment, comprising:

A, the electromagnetic model refers to the electromagnetic characteristic of the model. Moreover, the spatial geometrical characteristic and dimensional characteristic are consistent with the model object.

B, the antenna of the mobile phone to be tested and the electromagnetic body model comprise the mobile phone to be tested and the antenna thereof and also the electromagnetic body model (including a human head electromagnetic model, a combined electromagnetic model of a human head electromagnetic model and a neck and shoulder electromagnetic model, or an integral electromagnetic model);

C, the electromagnetic scattering dimension l refers to the minimum diameter of a spherical surface encircling the mobile phone to be tested and the antenna thereof and the electromagnetic body model.

Step 106, calculating the minimum measurement distance of the antenna of the wireless mobile terminal according to the determined electromagnetic scattering dimension, comprising the following steps: calculating a first distance $r_1$, a second distance $r_2$ and a third distance $r_3$ according to electromagnetic scattering dimension; taking the maximum of the first distance, the second distance and the third distance as the minimum measurement distance of the antenna of the wireless mobile terminal, wherein $r_1=2l^2/\lambda$, $r_2=3\lambda$, $r_3=3l$, l is the electromagnetic scattering dimension. The above electromagnetic scattering body in the predetermined spatial area is a human body.

The step 106 is carried out as follows:

a. calculating the measurement distance $r_1$ (refer to the real lines in FIGS. 4 and 5), $r_2$ (refer to the dashdotted lines in FIGS. 4 and 5), and $r_3$ according to the parameter l obtained, wherein $r_1=2l^2/\lambda$, $r_2=3\lambda$, $r_3=3l$; and b. calculating the minimum measurement distance r of the antenna, wherein $r=\max(r_1, r_2, r_3)$ i.e. r is the maximum of $r_1$, $r_2$ and $r_3$.

Step 106 can also be carried out in another way, comprising the following steps:

a. calculating the measurement distance $r_1$ (see the real lines in FIGS. 4 and 5) and $r_2$ (see the dashdotted lines in FIGS. 4 and 5) according to the parameter l obtained, wherein $r_1=2l^2/\lambda$, $r_2=3\lambda$; and b. calculating the minimum measurement distance r of the antenna, wherein r is the maximum of $r_1$ and $r_2$.

Figure 4:
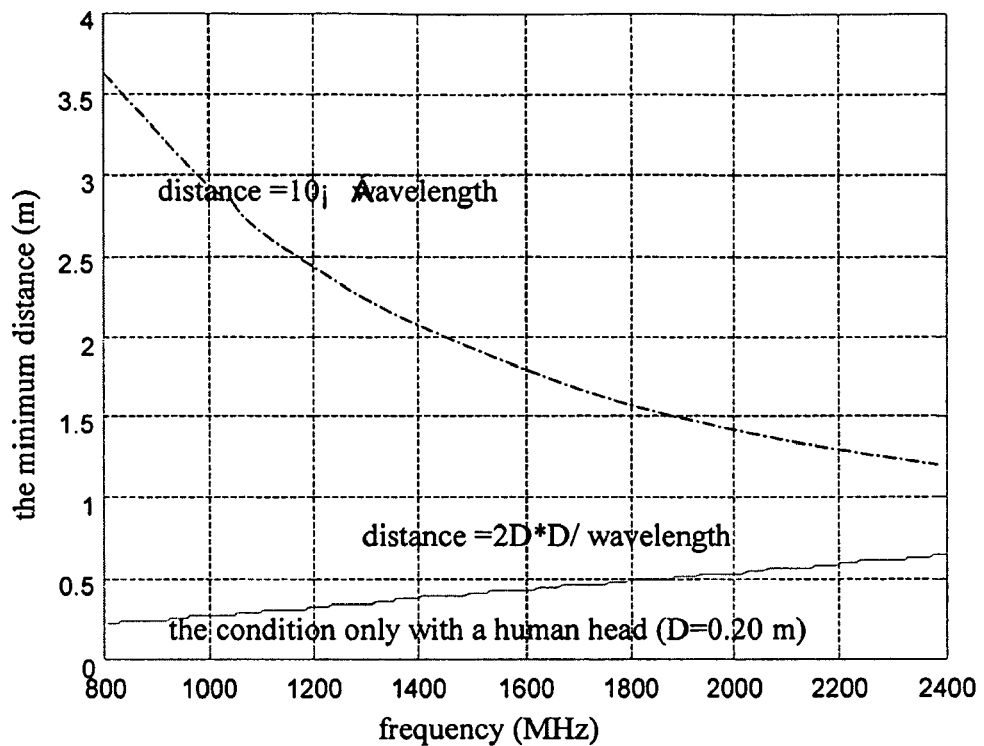
FIG. 4 is a schematic diagram of the result of the antenna measurement distance determined (electromagnetic body model 1: model of human head)
Figure 5:
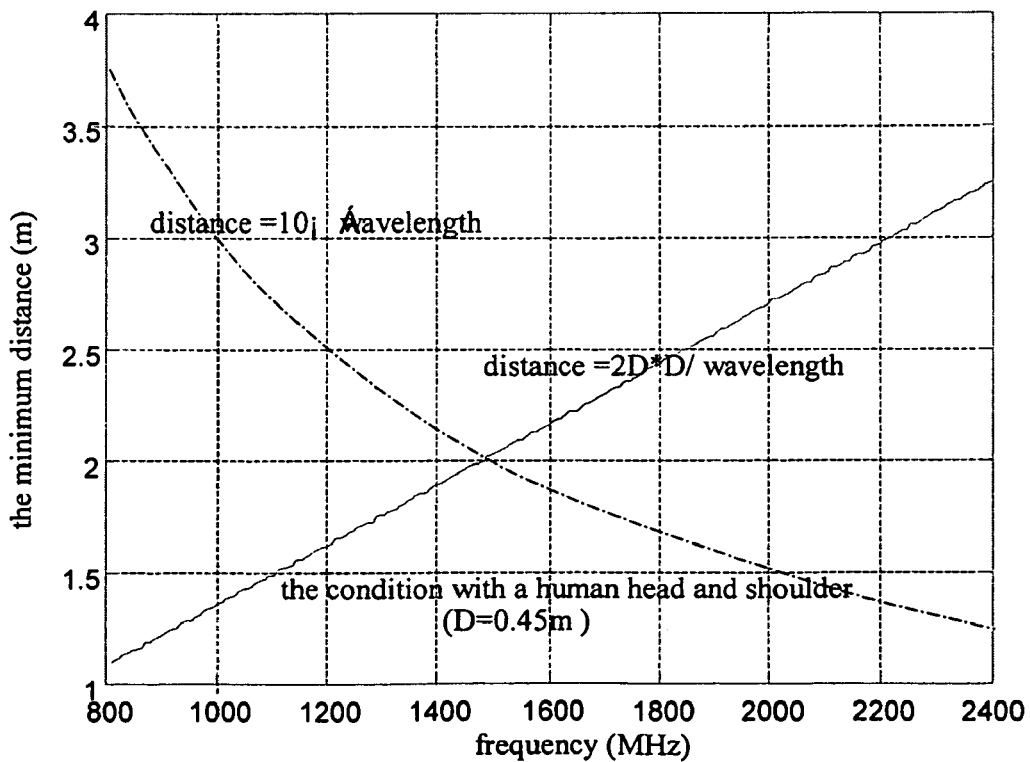
FIG. 5 is a schematic diagram of the result of the antenna measurement distance determined (electromagnetic body model 2: model of human head and shoulder).

The measurement results are as shown in FIGS. 4 and 5, wherein FIG. 4 is a schematic diagram of the result of antenna measurement distance determined (electromagnetic body model 1: model of human head) and FIG. 5 is a schematic diagram of the result of antenna measurement distance determined (electromagnetic body model 2: model of human head and shoulder).

As shown in FIG. 4, the broken line shows the measurement result which is obtained without taking the existence of a human head into consideration. The real line shows the measurement result which is obtained when take the existence a human head into consideration. It can be seen from the figure that the dashdotted lines (the bigger one) should be taken as the result in the circs of the electromagnetic body model 1.

Additionally, in the circs of the electromagnetic model 2 (i.e. an electromagnetic model consisting of human head and shoulder), as shown in FIG. 5, as to the frequency area in the left side of the junction of the upper and lower curves, the value shown by the dashdotted lines should be taken, while as to the frequency area in the right side, the value shown by the real lines should be taken. Wherein the electromagnetic scattering dimension is the minimum diameter of a spherical surface encircling the wireless mobile terminal to be tested and the electromagnetic scattering body in the predetermined spatial area.

According to the present invention, the predetermined spatial area refers to a spherical surface spatial area determined with a diameter from $0.01\lambda$ to $0.1\lambda$, wherein $\lambda$ is the wavelength of carrier wave; cables are low-loss cables; the radio frequency cable is a low-power radio frequency cable; and the simulator is a network simulator.

In addition, the electromagnetic scattering body in the predetermined spatial area according to the present invention is a human body and the electromagnetic scattering body comprises the head of the user of the wireless mobile terminal and further comprises the shoulder of the user of the wireless mobile terminal.

It can be seen from above, with the universal method for determining the minimum measurement distance of a mobile phone antenna of the present invention, electromagnetic scattering dimension of the mobile phone antenna and the electromagnetic scattering body in the predetermined spatial area is determined and measured in a simulated network environment in an electric wave anechoic chamber, and parameters of the minimum measurement distance of the mobile phone antenna can be calculated and obtained. The method has low requirement on environment and is easy to be tested and convenient to be carried out.

According to another embodiment of the present invention, a computer program and a computer program product thereof are provided. Wherein the computer program product comprises instructions for causing a processor to perform the processes illustrated above with refer to FIGS. 1-5.

Obviously, one skilled in the art shall understand that various modules and steps above can be realized with general computing devices and can be integrated into one single computing device or distributed within a network consisting of multiple computing devices, and alternatively, the various modules and steps above can be realized with the program codes executable by the computing devices, and thus these program codes can be stored in memory devices so as to be executed by the computing devices, or the various modules and steps above can be formed into individual integrated circuit modules, or a plurality of the modules or steps can be formed into a single integrated circuit module so as to be realized. Therefore, the present invention is not limited to any particular hardware or software combination. It should be understood that alterations of the embodiments are apparent to one skilled in the art and do not depart from the scope and spirit of the present invention.

The present invention has been shown with reference to the above-described embodiments, and it is not to be limited by the above embodiments. It is understood by those skilled in the art various alterations and changes may be made within the spirit and scope of the invention. All modifications, substitute equivalents or improvements made therein are intended to be embraced in the claims of this invention.

What is claimed is:

1. A method for determining the antenna minimum measurement distance of a wireless mobile terminal, wherein, comprising:

establishing an antenna testing environment of a wireless mobile terminal to be tested;

determining electromagnetic scattering dimension of the antenna of the mobile terminal to be tested and an electromagnetic scattering body in a predetermined spatial area in the test environment, wherein the electromagnetic scattering dimension is the minimum diameter of a spherical surface encircling both the wireless mobile terminal under tested and the electromagnetic scattering body in the predetermined spatial area; and calculating the minimum measurement distance of the antenna of the wireless mobile terminal according to the determined electromagnetic scattering dimension.

2. The method according to claim 1, wherein, the predetermined spatial area refers to a spherical surface spatial area determined with a diameter from $0.01\lambda$ to $0.1\lambda$, wherein $\lambda$ is the wavelength of carrier wave.

3. The method according to claim 1, wherein, in the of establishing the antenna testing environment, the step further comprises the following steps:

putting the wireless mobile terminal under tested and the antenna thereof, and a model of the electromagnetic scattering body on a test platform in a microwave anechoic chamber and connecting with a simulator through cables;

connecting the radio frequency port of a standard antenna with the simulator through a radio frequency cable;

configuring parameters of the simulator; and setting the back light of the wireless mobile terminal to be tested to the closed state or the darkest state, and setting the wireless mobile terminal to be tested to the standby state.

4. The method according to claim 3, wherein, the cables are low-loss cables.

5. The method according to claim 3, wherein, the radio frequency cable is a low-power radio frequency cable.

6. The method according to claim 3, wherein, the simulator is a network simulator.

7. The method according to claim 3, wherein, the step of configuring parameters of the simulator comprises: configuring the voice service to be a fixed voice service with a decided voice traffic.

8. The method according to claim 1, wherein, the electromagnetic scattering body in the predetermined spatial area is a human body.

9. The method according to claim 8, wherein, the electromagnetic scattering body comprises the head of the user of the wireless mobile terminal.

10. The method according to claim 9, wherein, the electromagnetic scattering body further comprises the shoulder of the user of the wireless mobile terminal.

11. A method for determining the antenna minimum measurement distance of a wireless mobile terminal, wherein, comprising:
 establishing an antenna testing environment of a wireless mobile terminal to be tested;
 determining electromagnetic scattering dimension of the antenna of the mobile terminal to be tested and an electromagnetic scattering body in a predetermined spatial area in the test environment; and
 calculating the minimum measurement distance of the antenna of the wireless mobile terminal according to the determined electromagnetic scattering dimension, wherein the calculation of the minimum measurement distance comprises:
  calculating a first distance $r_1$ a second distance $r_2$ and a third distance $r_3$ according to the electromagnetic scattering dimension;
  taking the maximum of the first distance, the second distance and the third distance as the minimum measurement distance of the antenna of the wireless mobile terminal, wherein $r_1=2l^2/\lambda$, $r_2=3\lambda$, $r_3=3l$, l is the electromagnetic scattering dimension, and $\lambda$ is the wavelength of carrier wave.

12. The method according to claim 11, wherein, the electromagnetic scattering body in the predetermined spatial area is a human body.

13. The method according to claim 11, wherein, in the step of establishing the antenna testing environment, the step further comprises:
 putting the wireless mobile terminal under tested and the antenna thereof, and a model of the electromagnetic scattering body on a test platform in a microwave anechoic chamber and connecting with a simulator through cables;
 connecting the radio frequency port of a standard antenna with the simulator through a radio frequency cable;
 configuring parameters of the simulator; and
 setting the back light of the wireless mobile terminal to be tested to the closed state or the darkest state, and setting the wireless mobile terminal to be tested to the standby state.

14. The method according to claim 13, wherein, the simulator is a network simulator.

15. The method according to claim 13, wherein, the step of configuring parameters of the simulator comprises: configuring the voice service to be a fixed voice service with a decided voice traffic.

16. A method for determining the antenna minimum measurement distance of a wireless mobile terminal, wherein, comprising:
 establishing an antenna testing environment of a wireless mobile terminal to be tested;
 determining electromagnetic scattering dimension of the antenna of the mobile terminal to be tested and an electromagnetic scattering body in a predetermined spatial area in the test environment; and
 calculating the minimum measurement distance of the antenna of the wireless mobile terminal according to the determined electromagnetic scattering dimension, wherein the calculation of the minimum measurement distance comprises:
  calculating a first distance $r_1$ and a second distance $r_2$ according to the electromagnetic scattering dimension;
  taking the maximum of the first distance and the second distance as the minimum measurement distance of the antenna of the wireless mobile terminal, wherein $r_1=2l^2/\lambda$, $r_2=3\lambda$, l is the electromagnetic scattering dimension, and $\lambda$ is the wavelength of carrier wave.

17. The method according to claim 16, wherein, the electromagnetic scattering body in the predetermined spatial area is a human body.

18. The method according to claim 16, wherein, in the step of establishing the antenna testing environment, the step further comprises:
 putting the wireless mobile terminal under tested and the antenna thereof, and a model of the electromagnetic scattering body on a test platform in a microwave anechoic chamber and connecting with a simulator through cables;
 connecting the radio frequency port of a standard antenna with the simulator through a radio frequency cable;
 configuring parameters of the simulator; and
 setting the back light of the wireless mobile terminal to be tested to the closed state or the darkest state, and setting the wireless mobile terminal to be tested to the standby state.

19. The method according to claim 18, wherein, the step of configuring parameters of the simulator comprises: configuring the voice service to be a fixed voice service with a decided voice traffic.

* * * * *